(12) United States Patent
Li et al.

(10) Patent No.: US 11,869,809 B2
(45) Date of Patent: Jan. 9, 2024

(54) SEMICONDUCTOR COMPONENTS HAVING CONDUCTIVE VIAS WITH ALIGNED BACK SIDE CONDUCTORS

(71) Applicant: Micron Technology, Inc., Boise, ID (US)

(72) Inventors: Jin Li, Meridian, ID (US); Tongbi Jiang, Santa Clara, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/015,003

(22) Filed: Sep. 8, 2020

(65) Prior Publication Data

US 2021/0134674 A1    May 6, 2021

Related U.S. Application Data

(60) Continuation of application No. 13/187,730, filed on Jul. 21, 2011, now abandoned, which is a division of
(Continued)

(51) Int. Cl.
*H01L 21/768* (2006.01)
*H01L 23/00* (2006.01)
(Continued)

(52) U.S. Cl.
CPC ........ *H01L 21/76898* (2013.01); *H01L 24/96* (2013.01); *H01L 25/0657* (2013.01);
(Continued)

(58) Field of Classification Search
CPC ............... H01L 21/76898; H01L 24/96; H01L 25/0657; H01L 25/50; H01L 21/6836; H01L 24/16; H01L 2224/0401; H01L 23/12; H01L 2221/68359; H01L 2221/68372; H01L 2224/02372;
(Continued)

(56) References Cited

U.S. PATENT DOCUMENTS 6,221,751 B1   4/2001   Chen et al.
6,800,930 B2   10/2004  Jackson et al.
(Continued)

FOREIGN PATENT DOCUMENTS

JP   2007311385 A   11/2007
WO   2006019156 A1   2/2006
(Continued)

OTHER PUBLICATIONS

Summons to Attend Oral Proceedings mailed Dec. 12, 2019 for European Patent Application No. 10751155.2, 9 pages.
(Continued)

*Primary Examiner* — Thanhha S Pham
(74) *Attorney, Agent, or Firm* — Perkins Coie LLP

(57) ABSTRACT

A semiconductor component includes a semiconductor substrate, conductive vias in the substrate having terminal portions, a polymer layer on the substrate and back side conductors formed by the terminal portions of the conductive vias embedded in the polymer layer. A stacked semiconductor component includes a plurality of components having aligned conductive vias in electrical communication with one another.

20 Claims, 6 Drawing Sheets

Related U.S. Application Data application No. 12/402,649, filed on Mar. 12, 2009, now Pat. No. 7,998,860.

(51) Int. Cl.
*H01L 25/065* (2023.01)
*H01L 25/00* (2006.01)
*H01L 21/683* (2006.01)

(52) U.S. Cl.
CPC .......... *H01L 25/50* (2013.01); *H01L 21/6836* (2013.01); *H01L 24/16* (2013.01); *H01L 2221/68359* (2013.01); *H01L 2221/68372* (2013.01); *H01L 2221/68381* (2013.01); *H01L 2224/02372* (2013.01); *H01L 2224/0401* (2013.01); *H01L 2224/05008* (2013.01); *H01L 2224/05025* (2013.01); *H01L 2224/0557* (2013.01); *H01L 2224/05111* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05164* (2013.01); *H01L 2224/05166* (2013.01); *H01L 2224/05169* (2013.01); *H01L 2224/05171* (2013.01); *H01L 2224/05181* (2013.01); *H01L 2224/05184* (2013.01); *H01L 2224/05611* (2013.01); *H01L 2224/05644* (2013.01); *H01L 2224/05664* (2013.01); *H01L 2224/13025* (2013.01); *H01L 2224/16145* (2013.01); *H01L 2224/16146* (2013.01); *H01L 2224/27416* (2013.01); *H01L 2224/83102* (2013.01); *H01L 2224/92125* (2013.01); *H01L 2225/06513* (2013.01); *H01L 2225/06527* (2013.01); *H01L 2225/06541* (2013.01); *H01L 2924/0002* (2013.01); *H01L 2924/00014* (2013.01); *H01L 2924/0103* (2013.01); *H01L 2924/014* (2013.01); *H01L 2924/01006* (2013.01); *H01L 2924/01013* (2013.01); *H01L 2924/01019* (2013.01); *H01L 2924/01024* (2013.01); *H01L 2924/01029* (2013.01); *H01L 2924/01033* (2013.01); *H01L 2924/01042* (2013.01); *H01L 2924/01046* (2013.01); *H01L 2924/01047* (2013.01); *H01L 2924/01057* (2013.01); *H01L 2924/01073* (2013.01); *H01L 2924/01074* (2013.01); *H01L 2924/01077* (2013.01); *H01L 2924/01078* (2013.01); *H01L 2924/01079* (2013.01); *H01L 2924/01082* (2013.01); *H01L 2924/12042* (2013.01); *H01L 2924/14* (2013.01); *H01L 2924/15311* (2013.01); *H01L 2924/3511* (2013.01)

(58) Field of Classification Search
CPC . H01L 2224/05008; H01L 2224/05025; H01L 2224/0557; H01L 2224/13025; H01L 2224/16145; H01L 2224/16146; H01L 2225/06513; H01L 2225/06527; H01L 2225/06541; H01L 2924/15311; H01L 24/02; H01L 24/05; H01L 2224/05024; H01L 2224/13024

See application file for complete search history.

(56) References Cited

U.S. PATENT DOCUMENTS

| | | | |
|---|---|---|---|
| 6,828,175 | B2 | 12/2004 | Wood et al. |
| 6,903,442 | B2 | 6/2005 | Wood et al. |
| 7,029,949 | B2 | 4/2006 | Farnworth et al. |
| 7,078,266 | B2 | 7/2006 | Wood et al. |
| 7,081,665 | B2 | 7/2006 | Wood et al. |
| 7,132,731 | B2 | 11/2006 | Wood et al. |
| 7,355,273 | B2 | 4/2008 | Jackson et al. |
| 7,417,325 | B2 | 8/2008 | Farnworth et al. |
| 7,466,028 | B1 | 12/2008 | Yu et al. |
| 7,473,582 | B2 | 1/2009 | Wood et al. |
| 7,642,128 | B1 | 1/2010 | Lin et al. |
| 7,863,187 | B2 | 1/2011 | Hiatt et al. |
| 7,998,860 | B2 | 8/2011 | Li et al. |
| 2004/0041260 | A1* | 3/2004 | Wood ............... H01L 21/76898 257/734 |
| 2005/0051883 | A1 | 3/2005 | Fukazawa |
| 2006/0016861 | A1* | 1/2006 | Daubenspeck ......... H01L 24/05 257/E23.021 |
| 2006/0275949 | A1 | 12/2006 | Farnworth et al. |
| 2006/0278979 | A1 | 12/2006 | Rangel |
| 2007/0049016 | A1 | 3/2007 | Hiatt et al. |
| 2007/0155048 | A1 | 7/2007 | Lee et al. |
| 2007/0257373 | A1* | 11/2007 | Akram ............... H01L 25/0657 257/774 |
| 2008/0079150 | A1 | 4/2008 | Simon et al. |
| 2008/0237849 | A1* | 10/2008 | Pratt .................... H01L 23/481 257/E21.294 |
| 2009/0004777 | A1 | 1/2009 | Kolan et al. |
| 2010/0096738 | A1* | 4/2010 | Simmons-Matthews .................... H01L 21/76898 257/737 |
| 2010/0178761 | A1 | 7/2010 | Chen et al. |
| 2010/0230794 | A1 | 9/2010 | Li et al. |

FOREIGN PATENT DOCUMENTS

| WO | 2006059589 A1 | 6/2006 |
|---|---|---|
| WO | 2006080337 A1 | 8/2006 |

OTHER PUBLICATIONS

European Search Report dated Sep. 26, 2016 in European Application No. 10751155.2, 8 pages.
Extended European Search Report dated Mar. 6, 2013 in European Application No. 1075155.2, 9 pages.
International Search Report and Written Opinion dated Mar. 31, 2010 in Intenational Application No. PCT/US2010/23760, 8 pages.
Office Action dated Feb. 12, 2013 in Japan Application No. 2011-554061, 8 pages.

* cited by examiner

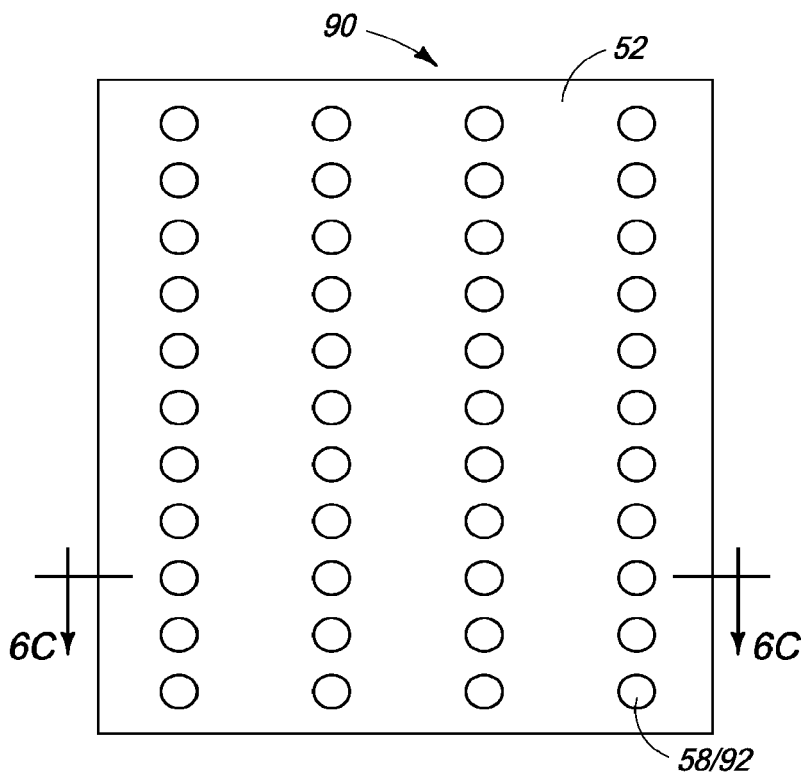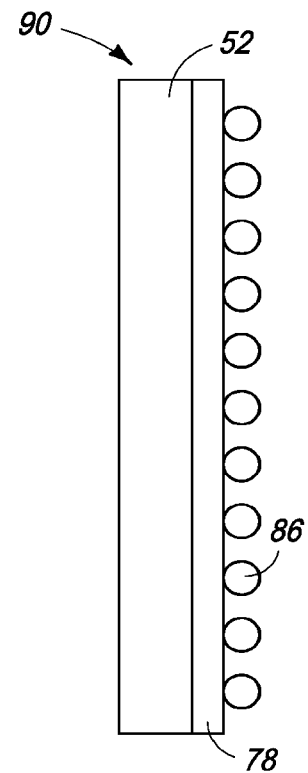
FIG. 6A  FIG. 6B
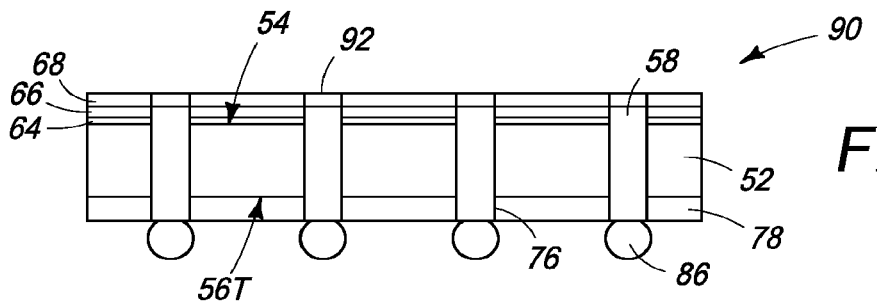
FIG. 6C
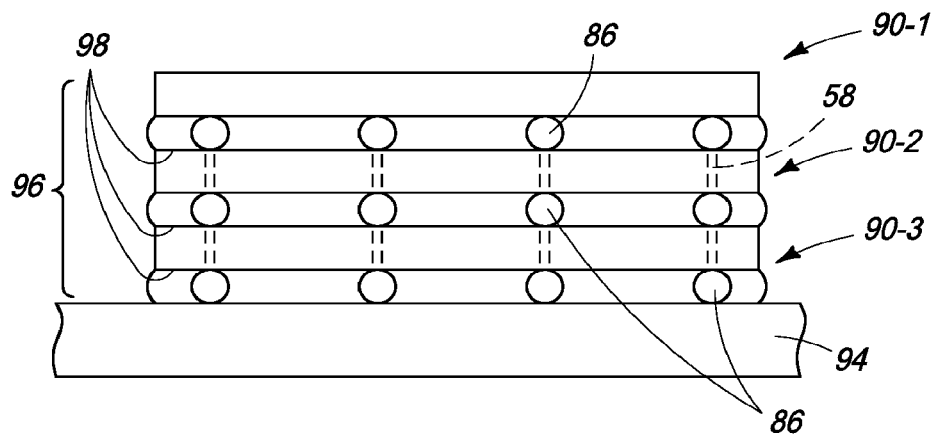
FIG. 7

SEMICONDUCTOR COMPONENTS HAVING CONDUCTIVE VIAS WITH ALIGNED BACK SIDE CONDUCTORS

CROSS REFERENCE TO RELATED APPLICATIONS

This application is a continuation of U.S. patent application Ser. No. 13/187,730, filed Jul. 21, 2011; which is a division of U.S. patent application Ser. No. 12/402,649 filed Mar. 12, 2009, now U.S. Pat. No. 7,998,860; each of which are incorporated herein by reference in their entirety.

BACKGROUND

Semiconductor components, such as chip scale packages, are being made thinner and smaller than previous generation components. At the same time, electrical and packaging requirements for semiconductor components are becoming more stringent. One challenge during fabrication of semiconductor components is the alignment of elements on the back side of a semiconductor substrate to elements on the circuit side. For example, conductive vias interconnect circuit side elements, such as circuit side conductors and bond pads, to back side elements, such as back side conductors and terminal contacts. The conductive vias are becoming smaller, such that conventional fabrication processes for aligning the conductive vias to back side elements are becoming more difficult.

FIGS. 1A-1E illustrate a semiconductor fabrication process in which the alignment of conductive vias in a semiconductor substrate to back side features on the substrate is an issue. As shown in FIG. 1A, a semiconductor wafer 10 includes a plurality of semiconductor substrates 12, such as semiconductor dice. The semiconductor wafer 10, and each of the semiconductor substrates 12 as well, include a circuit side 16 and a back side 18. In addition, each semiconductor substrate 12 includes a plurality of conductive vias 14 extending from circuit side 16 to the back side 18 thereof. Each conductive via 14 comprises a through via 20 in the semiconductor substrate 12 lined with a via insulator 22 and filled with a conductive metal.

As also shown in FIG. 1A, each semiconductor substrate 12 also includes a plurality of redistribution conductors 24 on the circuit side 16 in electrical communication with the conductive vias 14. The redistribution conductors 24 are insulated from the semiconductor substrate 12 by an inner dielectric layer 26, and are covered by an outer dielectric layer 28. The wafer 10 is attached to a wafer carrier 30 using a carrier adhesive 32, which permits back side fabrication processes, such as back side thinning and planarization, to be performed. These processes planarize the substrate 12, and form planarized contactors 42 (FIG. 1A) on the ends of the conductive vias 14. The wafer carrier 30 also allows other processes to be performed, such as the formation of back side elements (e.g., terminal contacts). In the present case, a photo patterning process is being performed to form back side conductors 34 in electrical communication with the conductive vias 14.

As shown in FIG. 1B, the photo patterning process is initiated by depositing a layer of resist 36 on the back side 18 of the wafer 10. The layer of resist 36 can be deposited using a conventional process such as spin coating. Next, as shown in FIG. 1C, the layer of resist 36 can be exposed and developed to form a photo mask 38 on the back side 18 of the wafer 10. The photo mask 38 includes a plurality of openings 40 which should align with the exposed contactors 42 on the conductive vias 14. Alignment can be achieved using alignment marks on the circuit side 16 and on the back side 18 of the wafer 10. However, due to the size of the conductive vias 14 and the size of the openings 40, and the limitations of conventional photo exposure equipment, alignment can be difficult to achieve. As shown in FIG. 2A, in order to facilitate alignment, the conductive vias 14 can be made larger than the openings 40 (represented by dotted lines in FIG. 2A) in the photo mask 38. For example, the conductive vias 14 can have an inside diameter (ID) of about 18 $\mu$m, and the openings 40 in the photo mask 38 can have a diameter (OD) of about 11 $\mu$m. This allows misalignment of about 3.5 $\mu$m on each side of the conductive vias 14 to occur.

FIG. 2A illustrates the optimal alignment situation wherein the centers of the conductive vias 14 and the centers of the openings 40 are in perfect alignment. However, as shown in FIG. 2B, in actual practice, the openings 40 in the photo mask 38 does not perfectly align with the conductive vias 14. As will be further explained, this situation can cause short circuits 44 (FIG. 2D) to form between the conductors 34 (FIG. 2D) and the substrate 12. As shown in FIG. 2C, the openings 40 in the photo mask 38 may completely miss the conductive vias 14. As will be further explained, this situation can form open circuits.

As shown in FIG. 1D, following formation of the photo mask 38, the contactors 42 can be etched to remove contaminants and native oxide layers. Next, as shown in FIG. 1E, the conductors 34 can be formed in the openings 40 using a process such as electroless deposition. The conductors 34 can comprise a highly conductive metal such as copper. As also shown in FIG. 1E, under bump metallization layers 46, 48 for terminal contacts (not shown) can be formed on the conductors 34. The under bump metallization layers 46, 48 can be formed using a suitable process such as electroless deposition out of suitable metals.

FIGS. 2D and 2E illustrate potential problems caused by misalignment of the conductors 34 to the conductive vias 14. As shown in FIG. 2D, misalignment by a small amount (e.g., <5 $\mu$m) can cause short circuits 44 between the conductors 34 and the semiconductor substrate 12. As shown in FIG. 2E, misalignment by a large amount (e.g., >9 $\mu$m) can cause an open circuit between the conductor 34 and the conductive via 14.

In view of the foregoing, improved methods for fabricating semiconductor components with back side elements are needed in the art. However, the foregoing examples of the related art and limitations related therewith, are intended to be illustrative and not exclusive. Other limitations of the related art will become apparent to those of skill in the art upon a reading of the specification and a study of the drawings.

BRIEF DESCRIPTION OF THE DRAWINGS

Exemplary embodiments are illustrated in the referenced figures of the drawings. It is intended that the embodiments and the figures disclosed herein are to be considered illustrative rather than limiting.

FIG. 6A is a plan view of a semiconductor component fabricated in accordance with the method of FIGS. 3A-3E;

FIG. 6B is a side elevation view of the semiconductor component;

FIG. 6C is a cross sectional view of the semiconductor component taken along section line 6C-6C of FIG. 6B; and FIG. 7 is a schematic side elevation view of stacked components fabricated in accordance with the method of FIGS. 3A-3E.

DETAILED DESCRIPTION

As used herein, "semiconductor component" means an electronic element that includes a semiconductor substrate having integrated circuits and semiconductor devices. "Wafer-level" means a process conducted on an element, such as a semiconductor wafer, containing multiple semiconductor components. "Chip scale" means a semiconductor component having an outline about the same as that of a semiconductor die.

Figure 3A:
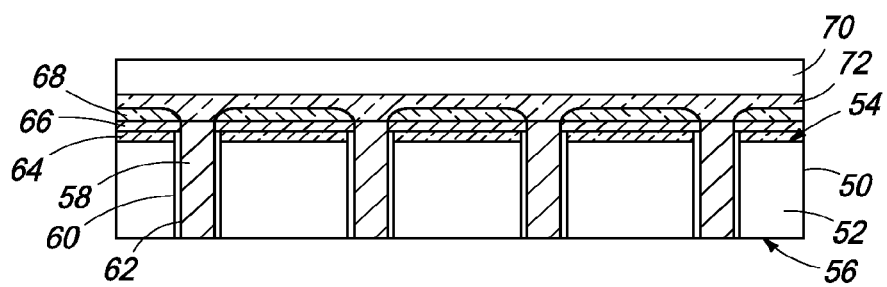
FIGS. 3A-3E are schematic cross sectional views illustrating a method for fabricating semiconductor components using mask less back side conductive via alignment.

Referring to FIGS. 3A-3E, a method for fabricating semiconductor components using maskless back side alignment to conductive vias is illustrated. As shown in FIG. 3A, a semiconductor wafer 50 can be provided. The semiconductor wafer 50 includes a plurality of semiconductor substrates 52, such as semiconductor dice, containing semiconductor devices and integrated circuits. The semiconductor wafer 50, and each of the semiconductor substrates 52 as well, include a circuit side 54 wherein the semiconductor devices and integrated circuits are located, and a back side 56. In addition, each semiconductor substrate 52 includes a plurality of conductive vias 58 extending from circuit side 54 to the back side 56 thereof. The conductive vias 58 are in electrical communication with the semiconductor devices and integrated circuits in the semiconductor substrate 52.

As shown in FIG. 3A, each conductive via 58 comprises a through, generally circular via 60 in the semiconductor substrate 52 lined with a via insulator 62 and filled with a conductive metal. The conductive metal can comprise a highly conductive metal such as copper, nickel, gold, aluminum, titanium, iridium, tungsten, silver, platinum, palladium, tantalum, molybdenum, zinc, tin, solder and alloys of these metals. The via insulator 62 can comprise an electrically insulating material such as a polymer (e.g., polyimide) or $SiO_2$. As also shown in FIG. 3A, each semiconductor substrate 52 also includes a plurality of circuit side redistribution conductors 66 on the circuit side 54 in electrical communication with the conductive vias 58. The circuit side redistribution conductors 66 are insulated from the semiconductor substrate 52 by an inner dielectric layer 64, and are covered by an outer dielectric layer 68.

All of the elements described so far including the semiconductor substrate 52 with semiconductor devices and integrated circuits therein, the conductive vias 58, the circuit side redistribution conductors 66, and the dielectric layers 64, 68 can be formed using well known semiconductor fabrication processes. For example, the conductive vias 58 can be formed by etching or laser machining the vias 60 through the substrate 52, forming the via insulators 62 in the vias using a process such as polymer deposition or oxide growth, and then depositing a metal in the vias using a process such as electrolytic deposition, electroless deposition, CVD, stenciling, or screen printing. Another method for forming the conductive vias 58 is to form the vias 60 part way though the substrate 52, filling the vias 60 with the conductive metal, and then thinning the substrate 52 using a process such as etching or sawing to expose the conductive metal.

The wafer 50 is attached to a wafer carrier 70 using a carrier adhesive 72, such as a double sided tape, which can be de-bonded using UV radiation. The wafer carrier 70 permits back side fabrication processes, such as back side thinning, to be performed. Thinning can be performed using a mechanical planarization apparatus, such as a grinder, or a chemical mechanical planarization (CMP) apparatus, to form a thinned back side 56T. Following back side thinning, the wafer 50 can have a thickness of from about 100 µm to about 725 µm. The wafer carrier 70 also allows other back side processes to be performed, such as the formation of back side elements (e.g., terminal contacts).

Figure 3B:
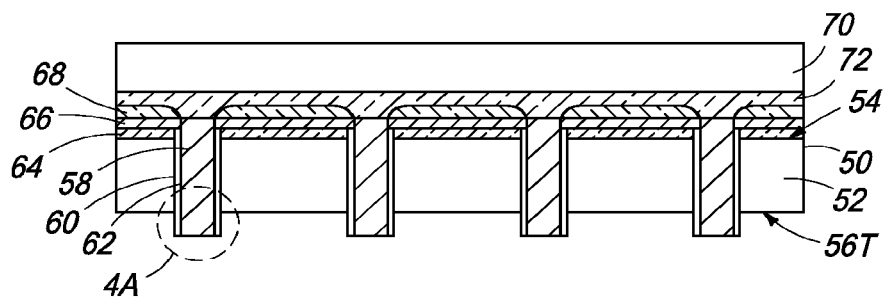
Figure 4A:
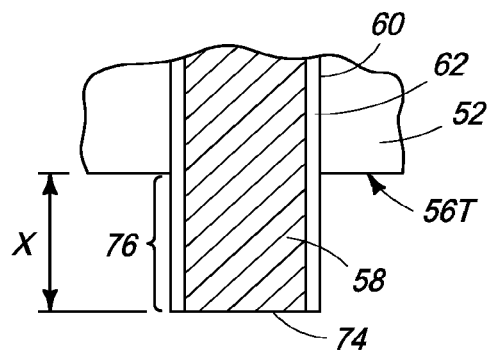
FIG. 4A is an enlarged schematic cross sectional view taken along line 4A of FIG. 3B illustrating a conductive following an etch back step.

Next, as shown in FIGS. 3B and 4A, a removing step is performed to remove portions of the back side 56 of the substrate 52, and expose terminal portions 76 (FIG. 4A) of the conductive vias 58. The removing step can be performed using a wet etching process, a dry etching process, or a plasma etching process, such as reactive ion etching (REI). For example, for etching a semiconductor substrate 52 made of silicon, a wet etching process can be performed using a solution of tetramethyl ammonium hydroxide (TMAH), or alternately a solution of potassium hydroxide (KOH). As shown in FIG. 4A, the removing step can be performed to remove about 5-10 µm of the semiconductor substrate 52, leaving the exposed terminal portions 76 of the conductive vias 58 with a height X from the thinned back side 56T of from 5-10 µm.

Figure 3C:
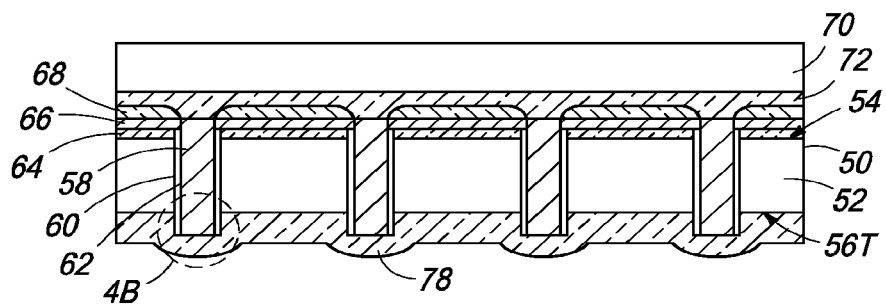
Figure 4B:
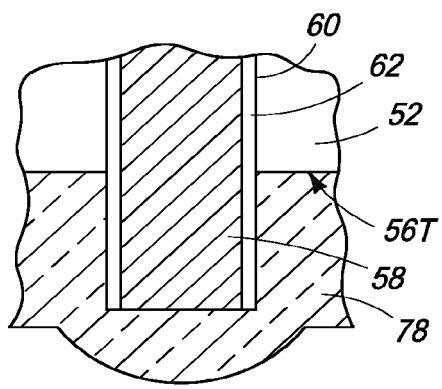
FIG. 4B is an enlarged schematic cross sectional view taken along line 4B of FIG. 3C illustrating the conductive via following a polymer deposition step.

Next, as shown in FIGS. 3C and 4B, a polymer deposition step is performed to form a polymer layer 78 which covers the thinned back side 56T of the semiconductor substrate 52, and encapsulates the exposed terminal portions 76 of the conductive vias 58. The polymer layer 78 can comprise a curable polymer such as silicone, polyimide or epoxy. In addition, the polymer layer 78 can include fillers, such as silicates, for adjusting the coefficient of thermal expansion (CTE), and the viscosity of the polymer material. The polymer layer 78 can be deposited on the thinned back side 56T using a suitable process such as spin coating, nozzle deposition, screen printing, stenciling or lithography. For example, with spin coating, a spin on polymer can be applied to the thinned back side 56T of the semiconductor wafer 50, which is then spun rapidly using a spin coater to drive off liquids. Following spin coating the polymer material can be cured. The thickness of the resulting deposited material depends on the viscosity of the solution and the spin speed. This thickness is selected to encapsulate the terminal portions 76 (FIG. 4A) of the conductive vias 58. By way of example, the polymer layer 78 can have a thickness of from 10-25 μm.

Figure 3D:
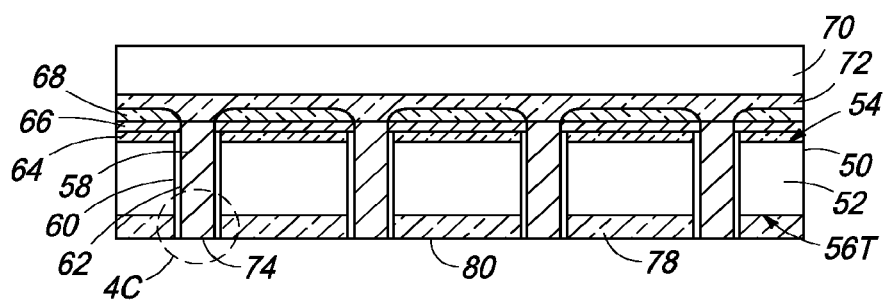
Figure 4C:
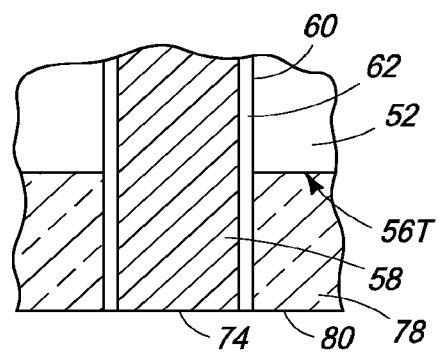
FIG. 4C is an enlarged schematic cross sectional view taken along line 4C of FIG. 3D illustrating the conductive via following a planarization step.

Next, as shown in FIGS. 3D and 4C, a planarization step is performed to form planarized contactors 74 on the conductive vias 58. The planarization step also planarizes the polymer layer 78 and forms a planarized polymer surface 80. The planarization step can be performed using chemical mechanical planarization (CMP). For example, suitable CMP apparatus are commercially available from manufacturers such as Westech, SEZ, Plasma Polishing Systems, or TRUSI. The planarization step can also be performed by mechanical planarization using a grinder, or by fly cutting using a surface planar unit, such as a DISCO fully automatic surface planar unit. The planarization step can be control to endpoint at the surface of the conductive via 58, or to remove a small amount of the conductive via 58. A representative thickness of the polymer layer 78 following the planarization step can be from 5-10 μm.

Figure 3E:
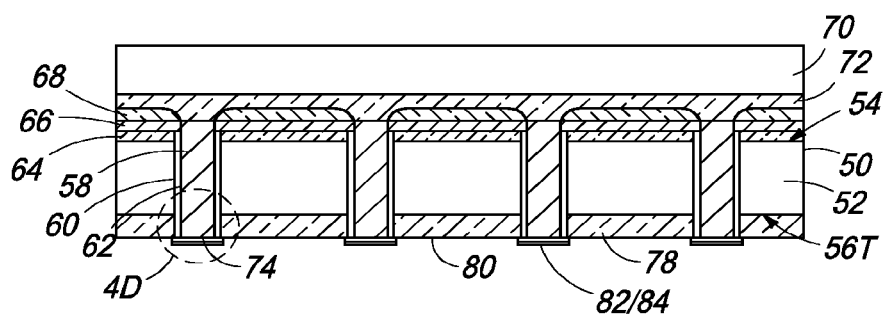
Figure 4D:
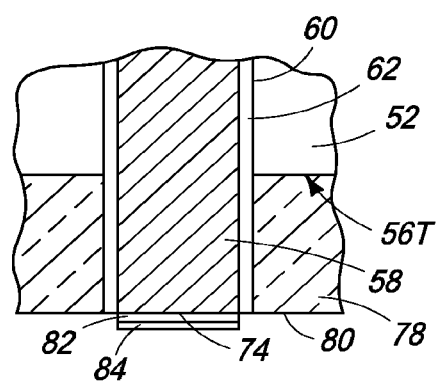
FIG. 4D is an enlarged schematic cross sectional view taken along line 4D of FIG. 3E illustrating alignment of the conductive via and a back side conductor.
Figure 5A:
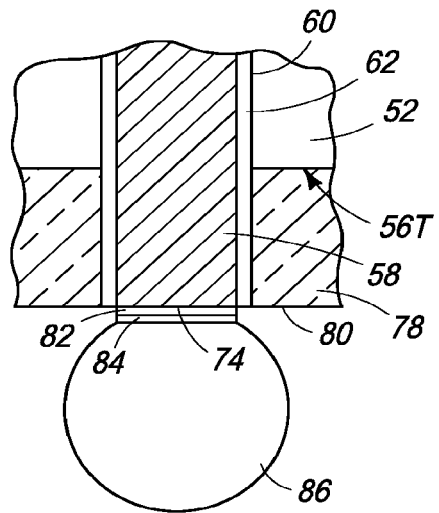
FIG. 5A is an enlarged schematic cross sectional view equivalent to FIG. 4A illustrating a back side terminal contact in electrical communication with the back side conductor.

Next, as shown in FIGS. 3E and 4D, a metallization step is performed to form under bump metallization layers (UBM) 82, 84 on the planarized contactors 74 of the conductive vias 58. The under bump metallization layers (UBM) 82, 84 can be formed using a deposition or plating process, such as electroless deposition, electrolytic deposition or CVD. The under bump metallization (UBM) layers 82, 84 can comprise one or more layers configured to provide surfaces for forming or bonding terminal contacts 86 (FIG. 5A). For example, the under bump metallization (UBM) layer 82 can comprise an adhesion layer formed of a metal such as nickel, zinc, chromium, or palladium. The under bump metallization layer 84 can comprise a solder wettable metal layer formed of a metal such as tin, palladium or gold.

Figure 1A:
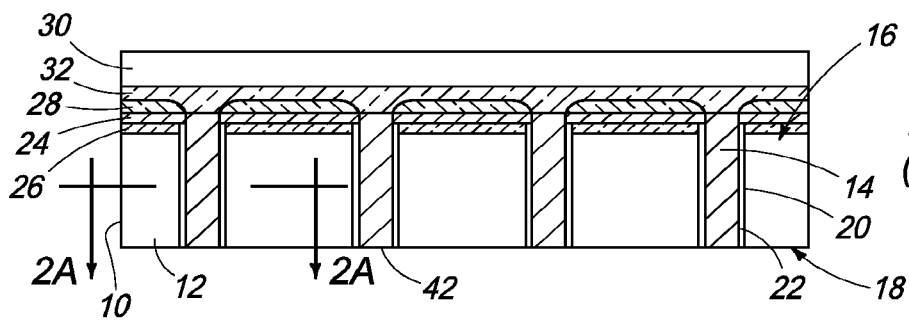
FIGS. 1A-1E are schematic cross sectional views illustrating steps in a prior art method for fabricating semiconductor components using a back side photo alignment step.
Figure 1B:
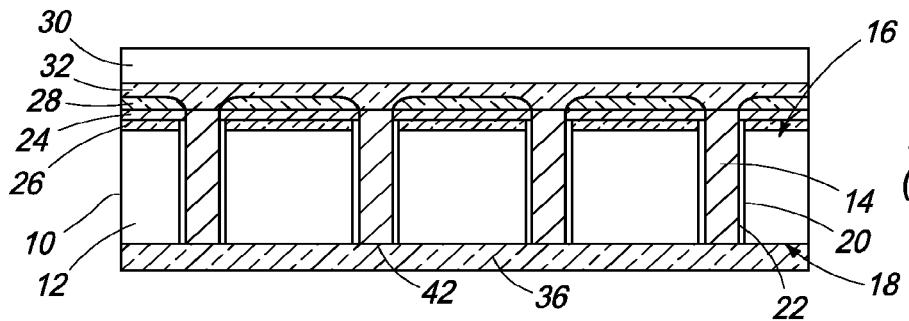
Figure 1C:
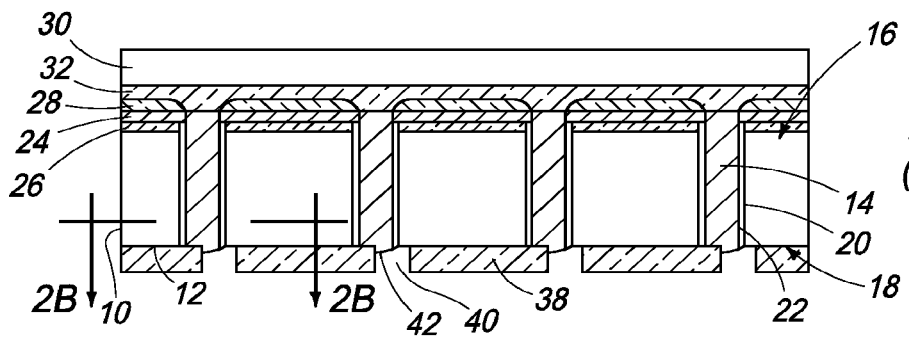
Figure 1D:
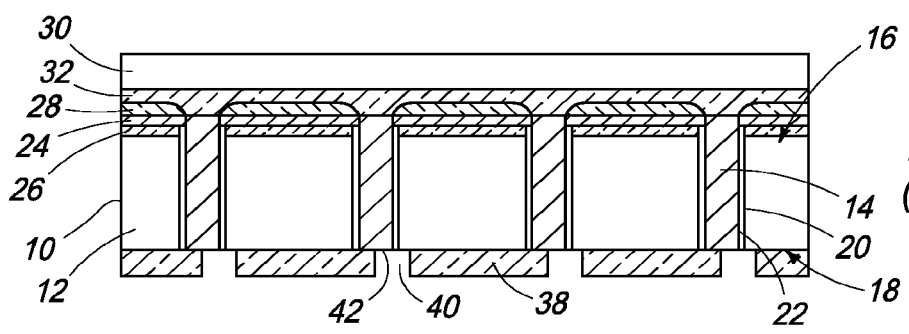
Figure 1E:
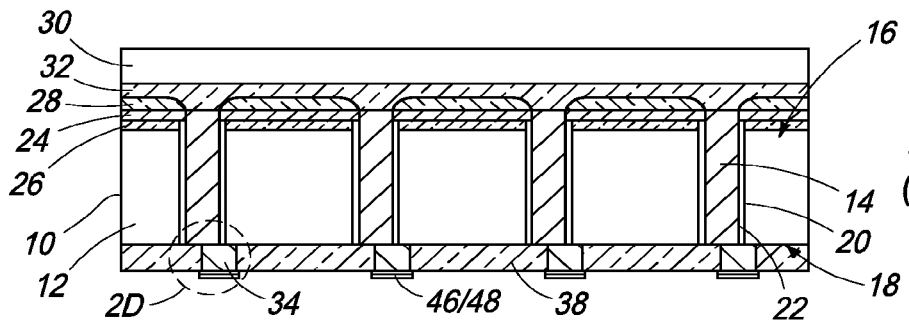
Figure 2A:
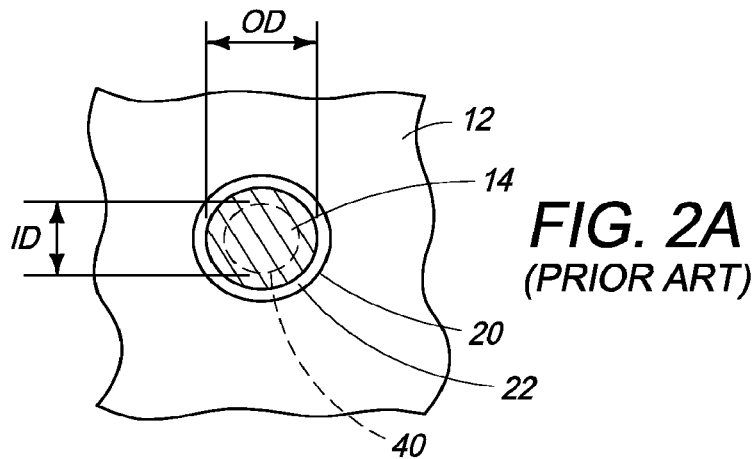
FIG. 2A is an enlarged schematic cross sectional view taken along line 2A-2A of FIG. 1A illustrating a conductive via in the prior art method.
Figure 2B:
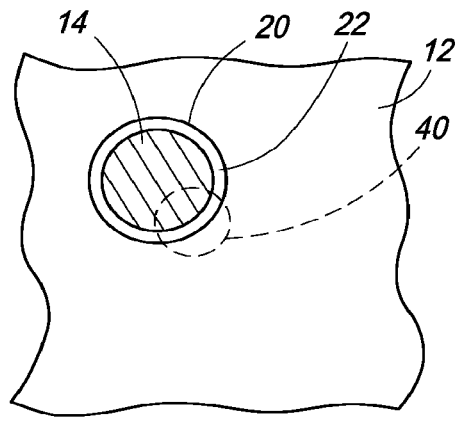
FIG. 2B is an enlarged schematic cross sectional view taken along line 2B-2B of FIG. 1C illustrating optimal alignment between the conductive via and a back side resist opening.
Figure 2C:
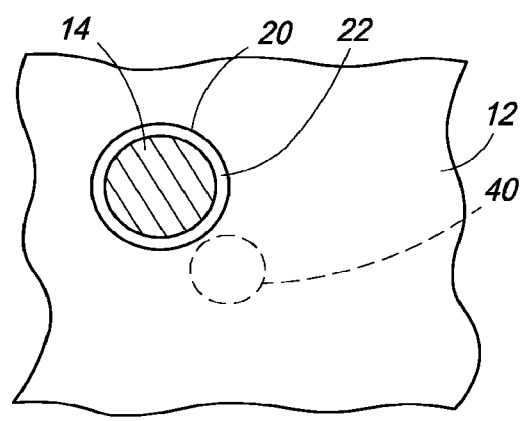
FIG. 2C is an enlarged schematic cross sectional view equivalent to FIG. 2B illustrating misalignment between the conductive via and the back side resist opening.
Figure 2D:
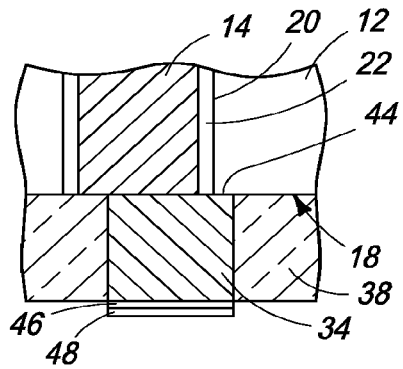
FIG. 2D is an enlarged schematic cross sectional view taken along line 2D of FIG. 1F illustrating misalignment between the conductive via and a back side conductor producing a short.
Figure 2E:
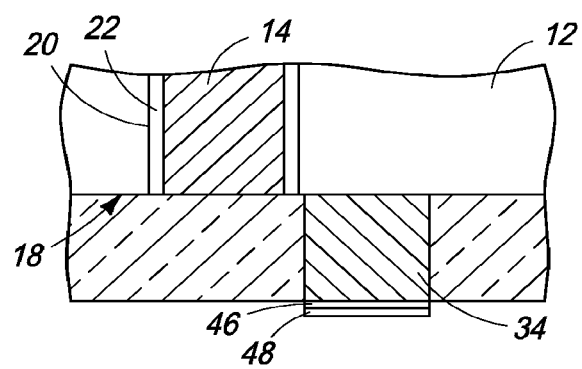
FIG. 2E is an enlarged schematic cross sectional view taken equivalent to FIG. 2D illustrating misalignment between the conductive via and a back side conductor producing an open.

The present method for fabricating semiconductor components (FIGS. 3A-3E) eliminates the photo mask 38 (FIG. 1C) of the prior art method (FIGS. 1A-1E). In addition, the present method (FIGS. 3A-3E) eliminates alignment of the mask 38 (FIG. 1C) to the conductive vias 14, and eliminates the formation of conductors 34 (FIG. 1E). With the present method (FIGS. 3A-3E), the terminal portions 76 (FIG. 4A) of the conductive vias 58 form conductors, which are self aligned to the conductive vias 58. This allows the conductive vias 58 to have an OD of about 10 μm or less. In addition, there is no possibility of forming a short circuit 44 (FIG. 2D) or of forming an open circuit (FIG. 2E). In this regard, the polymer layer 78 provides additional electrical insulation between the terminal portion 76 (FIG. 4A) and the semiconductor substrate 52, such that shorting cannot occur.

Figure 5B:
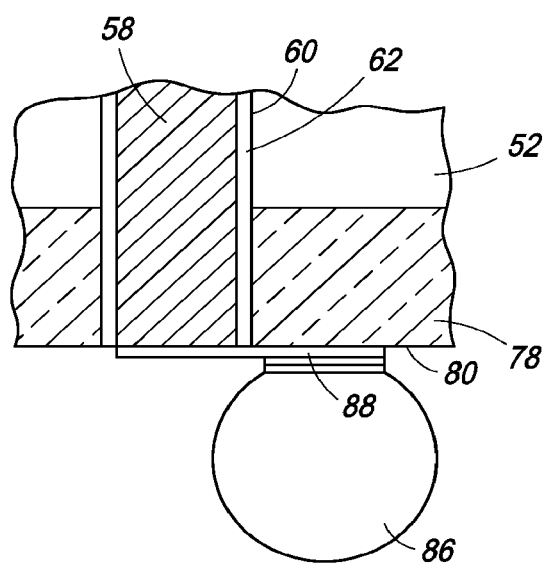
FIG. 5B is an enlarged schematic cross sectional view equivalent to FIG. 4A illustrating a back side redistribution conductor and terminal contact in electrical communication with the back side conductor.

Referring to FIGS. 5A and 5B, additional back side processes can be performed to form back side elements in electrical communication with the conductive vias 58. For example, as shown in FIG. 5A, terminal contacts 86 can be formed on the under bump metallization layers 82, 84. The terminal contacts 86 can comprise solder, another metal or a conductive polymer, formed using a suitable deposition process, such as stenciling and reflow of a solder alloy onto the under bump metallization layers 82, 84. As shown in FIG. 5B, back side redistribution conductors 88 can also be formed on the planarized surface 80 of the polymer layer 78 in electrical communication with the conductive vias 58. The back side redistribution conductors 88 can be formed using a suitable process such as electroless deposition through a mask, or by patterning a deposited layer of metal. In addition, terminal contacts 86 can be formed on the back side redistribution conductors 88, substantially as previously described.

Following the back side processing step, the semiconductor wafer 50 can be diced to form a plurality of chip scale semiconductor components 90 (FIG. 6). Dicing can be accomplished using a process such as lasering, sawing, water jetting or etching. Following the dicing step, the semiconductor components 90 (FIG. 6) can be removed from the carrier 70.

As shown in FIGS. 6A-6C, each semiconductor component 90 includes a semiconductor substrate 52 having a plurality of conductive vias 58. Each conductive via 58 includes a terminal portion 76 which forms a self aligned back side conductor, which is substantially equivalent to a prior art back side conductor 34 (FIG. 1E). In addition, the semiconductor component 90 includes a back side polymer layer 78 encapsulating the terminal portions 76 of the conductive vias 58, and terminal contacts 86 in electrical communication with the conductive vias 58. The semiconductor component 90 also includes an inner dielectric layer 64, circuit side redistribution conductors 66 in electrical communication with the conductive vias 58, and a circuit side outer dielectric layer 68. The outer dielectric layer 68 can include openings 92 (FIG. 6C) which align with the conductive vias 58 (or alternately with contacts in electrical communication with the conductive vias 58), which permit stacking of multiple semiconductor components 90.

Referring to FIG. 7, a stacked semiconductor component 96 includes a plurality of the semiconductor components 90 in a stacked array including an upper component 90-1, a middle component 90-2 and a lower component 90-3, mounted to a module substrate 94. The terminal contacts 86 on the upper component 90-1 can be bonded to the conductive vias 58 on the middle component 90-2, and the terminal contacts 86 on the middle component 90-2 can be bonded to the conductive vias 58 on the lower component 90-3. In addition, the terminal contacts 86 on the lower component 90-3 can be bonded to electrodes on the module substrate 94. Further, underfill layers 98 can be formed between the components 90-1, 90-2, 90-3 and the module substrate 94. The alignment of the conductive vias 58 on the components 90-1, 90-2, 90-3 facilitates the fabrication of the stacked component 56.

While a number of exemplary aspects and embodiments have been discussed above, those of skill in the art will recognize certain modifications, permutations, additions and subcombinations thereof. It is therefore intended that the following appended claims and claims hereafter introduced are interpreted to include all such modifications, permutations, additions and sub-combinations as are within their true spirit and scope.

What is claimed is:

1. A stacked semiconductor component comprising:
   a plurality of semiconductor components in a stacked array, each semiconductor component comprising:
   a semiconductor substrate having a circuit side and a back side opposite the circuit side;
   a polymer layer having a first polymer surface and a second polymer surface opposite the first polymer surface, wherein the first polymer surface is in contact with the back side of the semiconductor substrate;
   a plurality of conductive vias extending from the circuit side to the second polymer surface, each conductive via comprising
   a substrate via embedded in the semiconductor substrate; and
   a terminal portion integrally connected to the substrate via and embedded in the polymer layer, the terminal portion having a planarized contact surface generally parallel and in plane with the second polymer surface,
   wherein the conductive vias are circumferentially lined with an insulator that extends from the circuit side to the second polymer surface, and wherein the conductive vias are filled with a conductive metal; and
   a plurality of back side redistribution conductors on the second polymer surface, each of the plurality of back side redistribution conductors electrically coupled to the terminal portion of an individual one of the plurality of conductive vias,
   wherein the semiconductor components are configured to be stacked back side to circuit side with terminal portions of conductive vias of a first semiconductor component bonded to conductive vias at a circuit side of an adjacent second semiconductor component.

2. The stacked semiconductor component of claim 1 wherein the insulator lining the conductive vias comprises a polymer or $SiO_2$.

3. The stacked semiconductor component of claim 1 further comprising:
   a plurality of under bump metallization layers electrically coupled to the back side redistribution conductors.

4. The stacked semiconductor component of claim 1 further comprising a module substrate supporting the stacked array.

5. The stacked semiconductor component of claim 1 further comprising a third semiconductor component in the stacked array mounted to a module substrate.

6. The stacked semiconductor component of claim 1 wherein the plurality of conductive vias each have an inner-via diameter generally uniform throughout the conductive via, and wherein the semiconductor component further comprises a plurality of under bump metallization layers configured to electrically couple to the terminal portion of each conductive via, wherein each under bump metallization layer has a metallization layer diameter generally equal to the inner-via diameter.

7. The stacked semiconductor component of claim 6 wherein the under bump metallization layers include a metal adhesive layer.

8. The stacked semiconductor component of claim 1 wherein a thickness of the polymer layer is about 10 μm.

9. The stacked semiconductor component of claim 1 wherein a thickness of the polymer layer is about 5 μm.

10. A stacked semiconductor device comprising:
    two or more semiconductor components in a stacked array, each of the two or more semiconductor components comprising:
    a semiconductor substrate having a circuit side and a back side opposite the circuit side;
    a polymer layer having an inner surface in contact with the back side of the semiconductor substrate;
    a plurality of conductive vias extending from the circuit side to an outer surface of the polymer layer, each conductive via filled with a conductive metal and comprising
    a substrate portion embedded in the semiconductor substrate; and
    a terminal via integrally connected to the substrate via and embedded in the polymer layer, the terminal portion having a planarized contact surface generally parallel and coplanar with the outer surface of the polymer layer,
    wherein the conductive vias are circumferentially lined with an insulator that extends from the circuit side to the outer surface of the polymer layer; and
    a plurality of redistribution conductors on the outer surface of the polymer layer, each of the plurality of redistribution conductors electrically coupled to the terminal portion of an individual one of the plurality of conductive vias,
    wherein the two or more semiconductor components are configured to be stacked back side to circuit side with terminal portions of conductive vias of a first semiconductor component bonded to conductive vias at a circuit side of an adjacent second semiconductor component.

11. The stacked semiconductor device of claim 10 wherein the insulator lining the conductive vias comprises a polymer or $SiO_2$.

12. The stacked semiconductor device of claim 10 further comprising:
    a plurality of under bump metallization layers electrically coupled to the redistribution conductors.

13. The stacked semiconductor device of claim 10, further comprising a module substrate, wherein the stacked array is carried by the module substrate.

14. The stacked semiconductor device of claim 10 wherein the stacked array includes three or more semiconductor components.

15. The stacked semiconductor device of claim 10 wherein the plurality of conductive vias each have an inner-via diameter generally uniform throughout the conductive via.

16. The stacked semiconductor device of claim 15 wherein the semiconductor component further comprises a plurality of under bump metallization layers configured to electrically couple to the terminal portion of each conductive via, wherein each under bump metallization layer has a metallization layer diameter generally equal to the inner-via diameter.

17. The stacked semiconductor device of claim 16 wherein the under bump metallization layers include a metal adhesive layer.

18. The stacked semiconductor device of claim 10 wherein each of the two or more semiconductor components further comprises one or more circuit-side redistribution conductors carried by the circuit side of the semiconductor substrate.

19. The stacked semiconductor device of claim 18 wherein each of the two or more semiconductor components further comprises a dielectric layer carried by the circuit side of the semiconductor substrate over the one or more circuit-side redistribution conductors, wherein the dielectric layer includes a plurality of openings aligned with the conductive vias to allow a second semiconductor substrate to bond to the metal of the conductive vias.

20. The stacked semiconductor device of claim 10 wherein each of the plurality of redistribution conductors includes a first end electrically coupled to the terminal portion of the individual one of the plurality of conductive vias and a second end laterally offset from the first end.

* * * * *